US012627260B2

(12) United States Patent
Nohara et al.

(10) Patent No.: US 12,627,260 B2
(45) Date of Patent: May 12, 2026

(54) OSCILLATING CIRCUIT AND ELECTRONIC DEVICE

(71) Applicants: Inter-University Research Institute Corporation High Energy Accelerator Research Organization, Tsukuba (JP); Piezo Studio Inc., Sendai (JP)

(72) Inventors: Masaya Nohara, Tsukuba (JP); Takehito Ishii, Sendai (JP); Noritoshi Kimura, Sendai (JP)

( * ) Notice: Subject to any disclaimer, the term of this patent is extended or adjusted under 35 U.S.C. 154(b) by 0 days.

(21) Appl. No.: 18/877,823

(22) PCT Filed: Jun. 23, 2022

(86) PCT No.: PCT/JP2022/025047
§ 371 (c)(1),
(2) Date: Dec. 20, 2024

(87) PCT Pub. No.: WO2023/248411
PCT Pub. Date: Dec. 28, 2023

(65) Prior Publication Data
US 2025/0392257 A1     Dec. 25, 2025

(51) Int. Cl.
*H03B 5/12*       (2006.01)
*H03B 5/36*       (2006.01)

(52) U.S. Cl.
CPC ........... *H03B 5/1228* (2013.01); *H03B 5/364* (2013.01); *H03B 2200/0008* (2013.01); *H03B 2200/0012* (2013.01)

(58) Field of Classification Search
CPC ..................................................... H03B 5/1228
USPC ....................................................... 331/116 R
See application file for complete search history.

(56) References Cited

U.S. PATENT DOCUMENTS

2002/0135433 A1*   9/2002   Uchiyama .............. H03B 5/364
                                                        331/158
2023/0291355 A1*   9/2023   Nohara .................. H03B 5/364

* cited by examiner

*Primary Examiner* — Joseph Chang
(74) *Attorney, Agent, or Firm* — WOMBLE BOND DICKINSON (US) LLP

(57) ABSTRACT
An oscillation circuit which includes a Pierce circuit and a Colpitts circuit that share an oscillator and an input node to respective amplifiers and switches connected to output nodes of the respective amplifiers of the Pierce circuit and the Colpitts circuit. The switches are controlled to cause the oscillation circuit output oscillation signals of the Pierce circuit at the time of oscillation start-up and output oscillation signals of the Colpitts circuit at the time of steady-state oscillation.

11 Claims, 7 Drawing Sheets

| Parameters | | |
|---|---|---|
| Crystal | CTGS | Quartz |
| CL(pF) | 6(C1=18pF,C2=9pF) | |
| Lm(mH) | 1.45 | 13.2 |
| Rm(Ω) | 6.2 | 16.9 |
| Cm(fF) | 30 | 3.6 |
| Rx(Ω) | 10.2 | 24.3 |
| Q | 35267 | 117607 |

OFFSET FREQUENCY

CONTROL SIGNAL

CONTROL SIGNAL

OSCILLATION DETECTION CIRCUIT

OSCILLATION OUTPUT
(Vxo1/Vxo2)

OSCILLATING CIRCUIT AND ELECTRONIC DEVICE

TECHNICAL FIELD

The present invention relates to an oscillation circuit using an oscillator.

BACKGROUND ART

In recent years, among mobile phones and Internet-of-things (IoT) devices that connect all kinds of things to the Internet, small cordless electronic devices with wireless circuits have been required to extend the battery life. Therefore, reducing the power consumption of the electronic circuits and electronic components used in those devices has become an important technical objective.

Inverter-based Pierce circuits using quartz oscillators as shown in FIG. 10A have been widely used for oscillation circuits used in small IoT communication devices, and have been used for decades due to their simple circuit configurations. However, slow oscillation start-up due to the voltage component for the oscillation being not large enough and large power consumption for steady-state current flow have been technical issues.

CITATION LIST

Document 1: Masaya Miyahara, Yukiya Endo, Kenichi Okada, and Akira Matsuzawa, "A 64 μs Start-Up 26/40 MHz Crystal Oscillator with Negative Resistance Boosting Technique Using Reconfigurable Multi-Stage Amplifier", Proc. IEEE Symp. VLSI Circuits, 2018

Document 2: Zule Xu, Noritoshi Kimura, Kenichi Okada, and Masaya Miyahara, "Ultralow-Power Class-C Complementary Colpitts Crystal Oscillator", IEEE Journal of Solid-State Circuits, Letters, VOL. 3, 2020

SUMMARY OF THE INVENTION

Document 1 proposes a circuit, which is shown in FIG. 10B, in which a boost circuit is added for speeding up the oscillation start-up, in order to overcome the problem of slow oscillation start-up in Pierce circuits. Meanwhile, Document 2 proposes a circuit, shown in FIG. 11B, which can reduce steady-state current at the time of oscillation. This circuit is different from a Pearce circuit and is based on a source follower-based Colpitts circuit shown in FIG. 11A.

If it is possible to achieve both advantages of the above two circuits, i.e., the fast oscillation start-up in the circuit shown in FIG. 10B and the reduction of the steady-state current during oscillation in the circuit shown in FIG. 11B, the power consumption can be reduced furthermore as compared to the Pierce circuit. However, there is a problem that it is difficult to incorporate one of the circuits into the other circuit because the base circuit type is different.

The present invention has been achieved to solve the above problems, and an object of the present invention is to provide an oscillation circuit that achieves both fast start-up and low current consumption.

An oscillation circuit according to an aspect of the present invention comprises:

a Pierce circuit and a Colpitts circuit that share an oscillator and a node which serves as inputs to respective amplifiers; and switches connected to output nodes of the respective amplifiers of the Pierce circuit and the Colpitts circuit, wherein the switches are controlled to cause the oscillation circuit output oscillation signals of the Pierce circuit at the time of oscillation start-up and output oscillation signals of the Colpitts circuit at the time of steady-state oscillation.

An oscillation circuit according to an aspect of the present invention includes a Pierce circuit and a Colpitts circuit, wherein a first amplifier (A1) in the Pierce circuit and a second amplifier (A2) in the Colpitts circuit share a node which serves as inputs to the respective amplifiers, the oscillation circuit includes a first oscillation capacitance (C1) and a first switch (SW1) connected in parallel to the first oscillation capacitance (C1) between an output of the first amplifier (A1) and the ground, the oscillation circuit includes a second oscillation capacitance (C2) and a second switch (SW2) connected in parallel to the second oscillation capacitance (C2) between an output of the second amplifier (A2) and the ground, the oscillation circuit includes an oscillator (X1) between said input and said output of the first amplifier (A1), the oscillation circuit includes a third oscillation capacitance (C3) between said input and said output of the second amplifier (A2), and the oscillation circuit is configured to oscillate in a first mode at the time of oscillation start-up in which the first switch (SW1) and the second switch (SW2) are open and closed, respectively, and in a second mode at the time of steady-state oscillation in which the first switch (SW1) and the second switch (SW2) are closed and open, respectively.

In accordance with the present invention, it is possible to provide an oscillation circuit that achieves both fast start-up and low current consumption.

DETAILED DESCRIPTION OF THE INVENTION

Figure 10A:
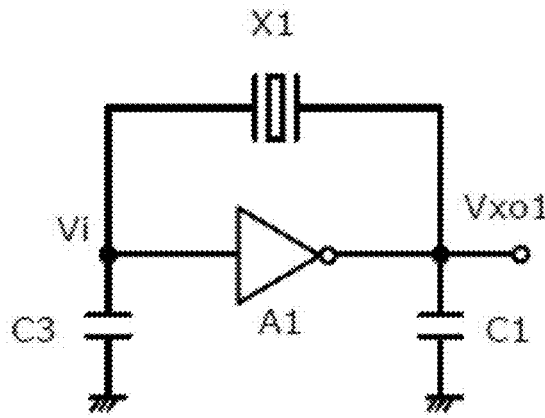
FIG. 10A shows a configuration example of a Pierce circuit.
Figure 10B:
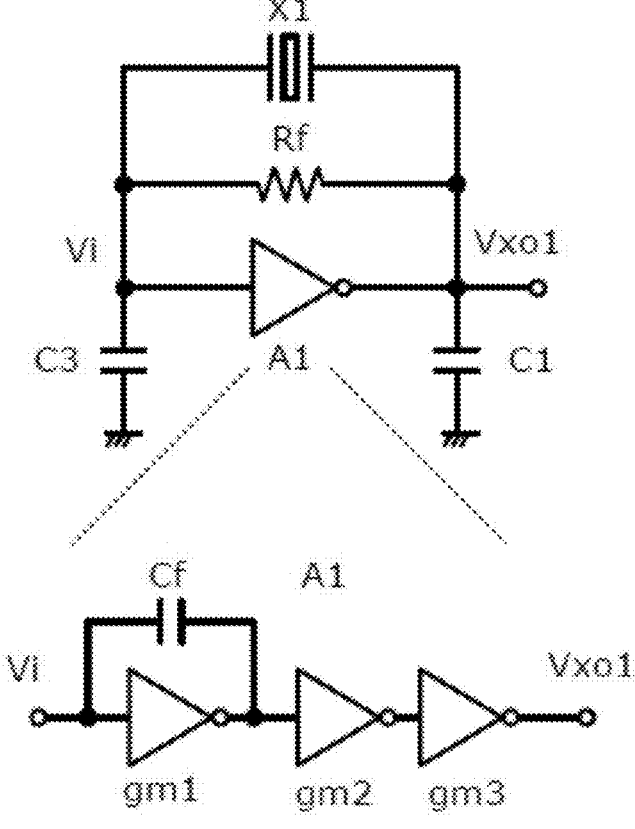
FIG. 10B shows a specific example of a Pierce circuit with a boost circuit.
Figure 11A:
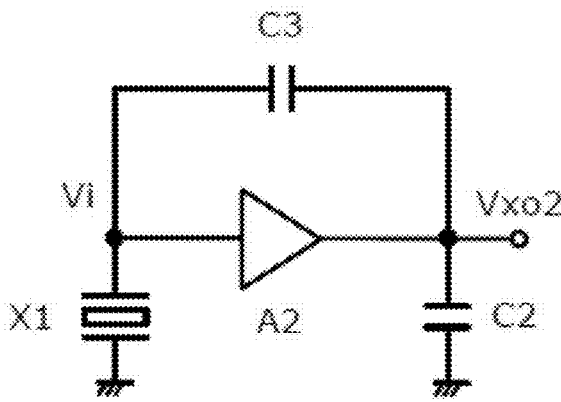
FIG. 11A shows a configuration example of a Colpitts circuit.
Figure 11B:
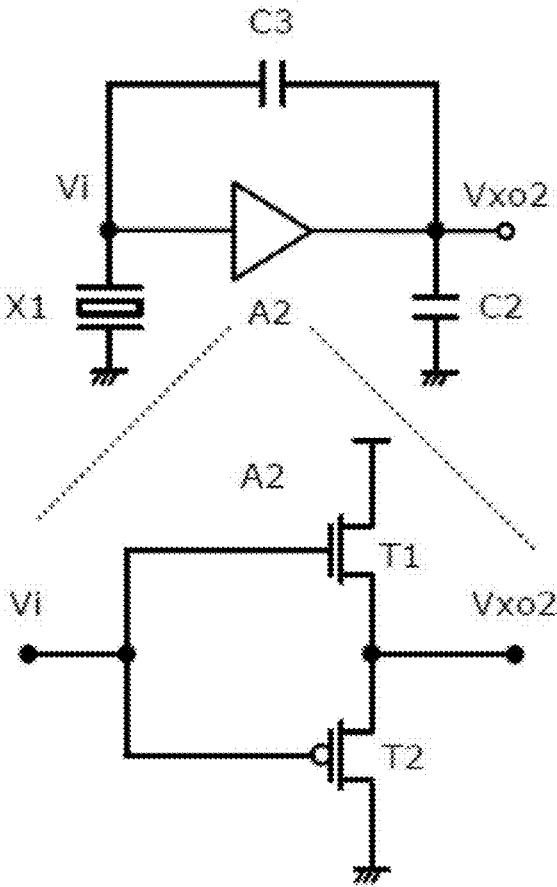
FIG. 11B shows a specific example of a source-follower-type Colpitts circuit.

The Pierce circuit shown in FIG. 10B is an inverter-based circuit. Meanwhile, the Colpitts circuit shown in FIG. 11B is a source-follower-based circuit. A Pierce circuit is characterized by a large current flow and relatively fast oscillation start-up. Meanwhile, a source-follower-based Colpitts circuit is characterized by relatively low current consumption at the time of steady-state oscillation. In the oscillation circuit according to the embodiment of the present invention, both circuit types described above are mixed, and both fast start-up and low current consumption are achieved by switching a circuit that outputs oscillation signals depending on whether it is the time of the oscillation start-up or the time of the steady-state oscillation.

Figure 1:
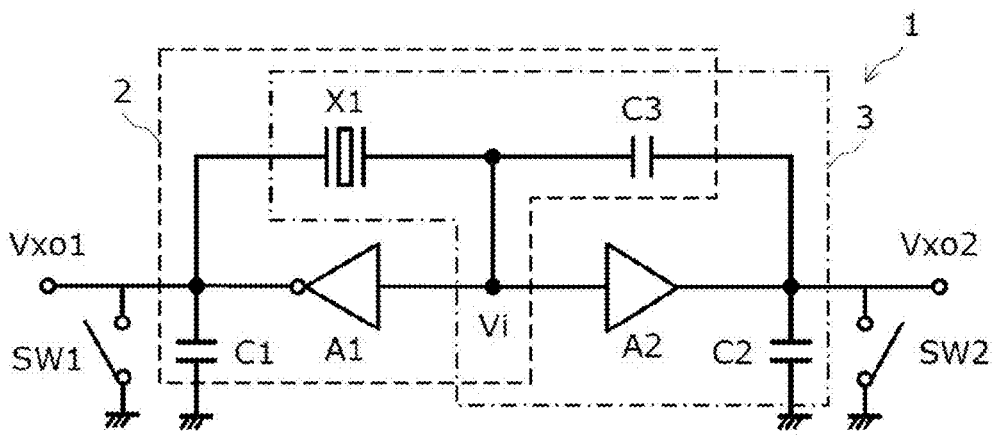
FIG. 1 shows a configuration example of an oscillation circuit according to an embodiment of the present invention.

FIG. 1 shows a configuration example of an oscillation circuit according to the embodiment of the present invention. The oscillation circuit 1 according to this embodiment is an oscillation circuit including a Pierce circuit 2, a Colpitts circuit 3, and switches connected to output nodes of the respective circuits. The Pierce circuit 2 and the Colpitts circuit 3 are configured to share an oscillator and an input node to the respective amplifiers. There are two switches connected to the ground and output nodes of the respective amplifiers of the Pierce circuit 2 and the Colpitts circuit 3. The two switches are controlled to cause the oscillation circuit output oscillation signals of the Pierce circuit 2 at the time of oscillation start-up, and output oscillation signals of the Colpitts circuit 3 at the time of steady-state oscillation.

More specifically, the respective amplifiers (first amplifier A1, second amplifier A2) of the Pierce circuit 2 and the Colpitts circuit 3 share an input node to the amplifiers, and there are oscillation capacities (first oscillation capacity C1 and second oscillation capacity C2) arranged between the output node of the first amplifier A1 and the output node of the second amplifier A2 and the ground, and switches (first switch SW1 and second switch SW2) connected in parallel to the respective oscillation capacities (C1, C2). Moreover, there are an oscillator X1 between the input and output of the first amplifier A1, and an oscillation capacity C3 (third oscillation capacity) between the input and output of the second amplifier A2.

Figure 2A:
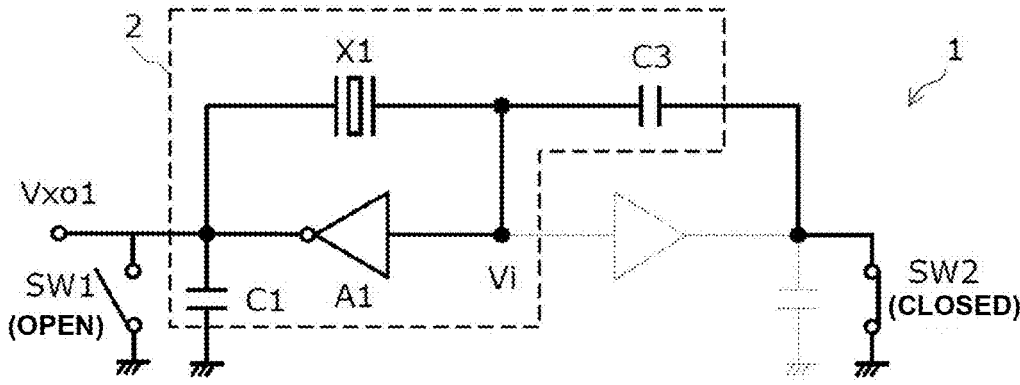
FIG. 2A is for explaining the states of switches in the oscillation circuit according to the embodiment of the present invention at the time of oscillation start-up.
Figure 2B:
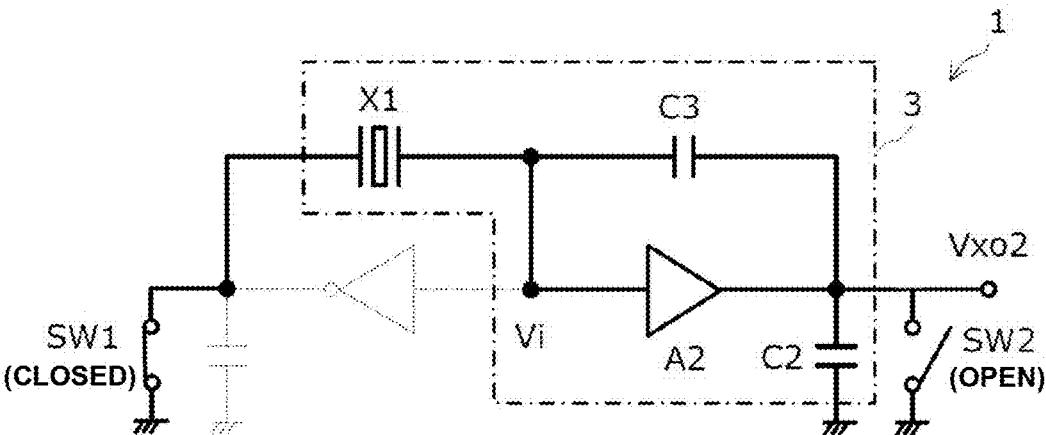
FIG. 2B is for explaining the states of the switches in the oscillation circuit according to the embodiment of the present invention at the time of steady-state oscillation.

FIGS. 2A and 2B are for explaining the states of the switch of the oscillation circuit at the time of oscillation start-up and at the time of steady-state oscillation. There are two operating modes, in which the switches SW1 and SW2 are respectively open and closed at the time of oscillation start-up and the switches SW1 and SW2 are respectively closed and open at the time of steady-state oscillation. The oscillation circuit operates as a Pierce circuit 2 at the time of oscillation start-up and as a Colpitts circuit 3 at the time of steady-state oscillation. By having a configuration that switches the operating mode on the basis of oscillation start-up or steady-state oscillation, it is possible to have an oscillation circuit that achieves both fast start-up and low current consumption.

Here, a circuit, as shown in FIG. 10B, having a boost circuit in which a plurality of amplifier circuits that enhance the oscillation start-up capability are connected in series may be used as the Pierce circuit, and a circuit, as shown in FIG. 11B, that further reduces the current consumption during steady-state oscillation may be used as the Colpitts circuit.

In FIG. 10B, an amplifier A1 of a Pierce circuit has a configuration in which three stages of amplifier circuits (gm1-gm3) are connected in series, and the amplifier circuits (gm1 and gm2) of the first and second stages are boost circuits. The first stage amplifier circuit gm1 further includes a capacitive feedforward path constituted by a capacity Cf. In FIG. 11B, an amplifier A2 of a Colpitts circuit is a source-follower type Colpitts circuit in which an NMOS transistor T1 and a PMOS transistor T2 are cascaded. The number of stages of the amplifier circuit of the amplifier A1 of the Pierce circuit is not limited to three stages, which are shown as an example in FIG. 10B.

Figures 3, 4:
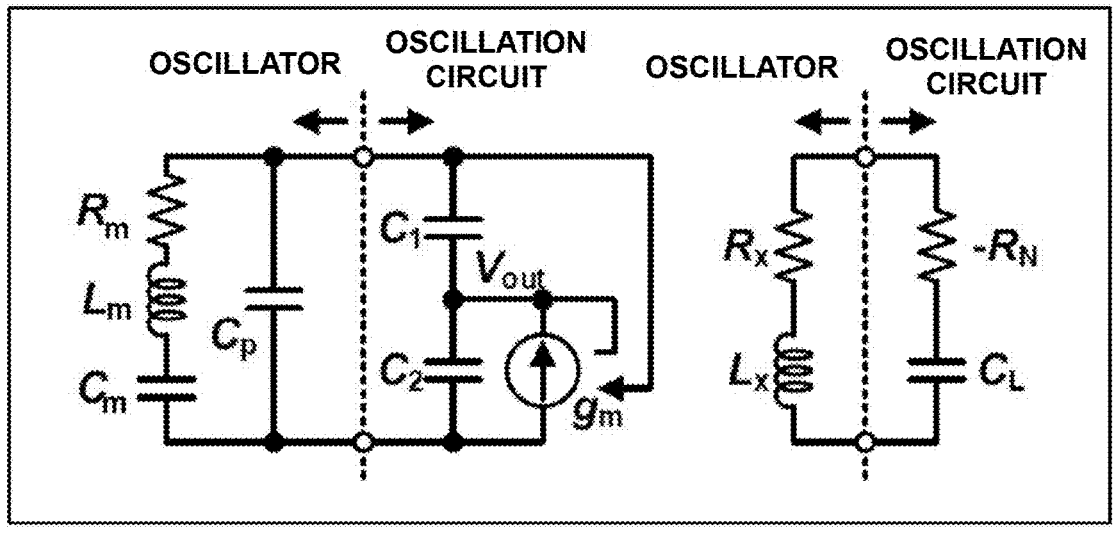
FIG. 3 shows a commonly-known equivalent circuit in an oscillator using a piezoelectric oscillator.
FIG. 4 shows an example of representative values of constants of the equivalent circuit of the oscillator.

Quartz oscillators are often used for the oscillator X1, but CTGS ($Ca_3TaGa_3Si_2O_{14}$) oscillators that use a Langasite type piezoelectric single crystal may be used for the oscillator X1. FIG. 3 shows a commonly-known equivalent circuit of an oscillator using a piezoelectric oscillator. The right side of FIG. 3 illustrates an equivalent circuit that is a simplified version of the circuit on the left side. The left side of the dotted line in FIG. 3 shows an equivalent circuit of the oscillator and the right side shows an equivalent circuit of the oscillation circuit. In order to oscillate, it is necessary to produce a negative resistance $R_N$ on the oscillation circuit side that cancels the series equivalent resistance $R_x$ on the oscillator side, thereby shortening the oscillation start-up by increasing the value of the negative resistance $R_N$.

FIG. 4 shows representative values of constants of the equivalent circuit of the oscillator. The amplifier A1 of the Pierce circuit has a configuration in which three-stage amplifier circuits are connected in series, and there is a capacitive feed-forward path. Thereby, it is possible to obtain a larger negative resistance $R_N$ with low power consumption. Furthermore, by using a Langasite type oscillator CTGS as the oscillator of the oscillation circuit 1, the series equivalent inductance $L_m$ is about an order of magnitude smaller than that of crystal oscillators, and therefore it is possible to accelerate the oscillation start-up by an order of magnitude.

Figure 5:
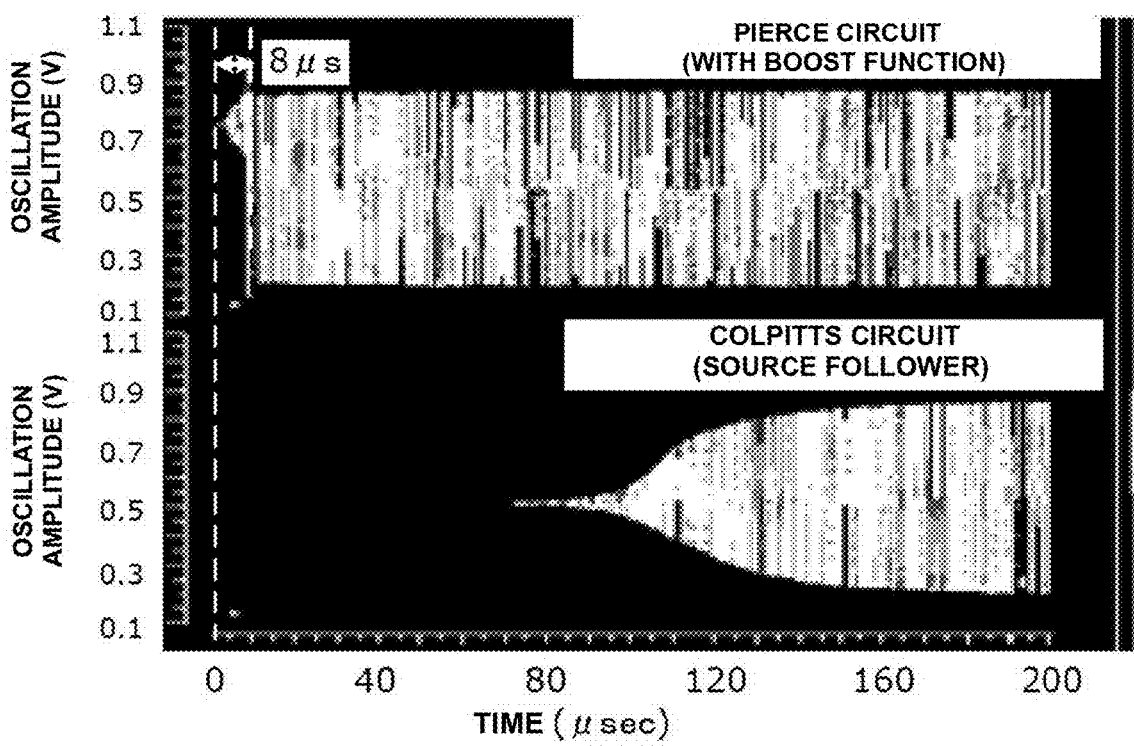
FIG. 5 shows an example of oscillation amplitude start-up characteristics according to the embodiment of the present invention.
Figure 6:
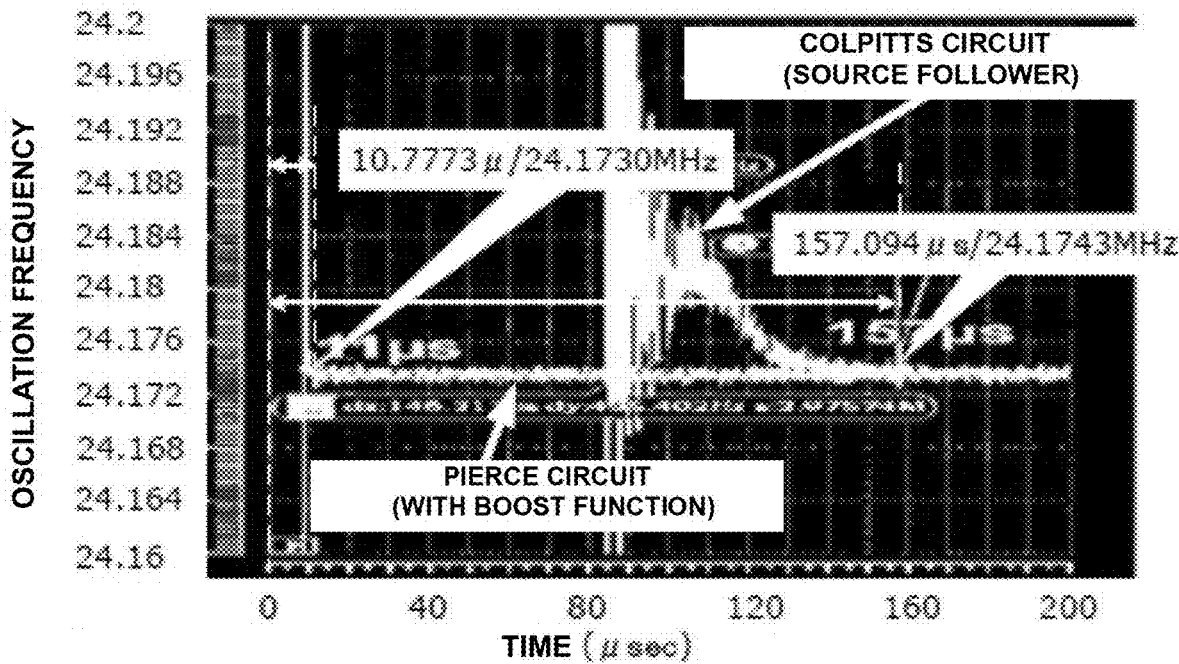
FIG. 6 shows an example of oscillation frequency start-up characteristics according to the embodiment of the present invention.

FIGS. 5 and 6 show examples of oscillation amplitude start-up characteristics and oscillation frequency start-up characteristics according to the embodiment of the present invention. In the configuration example of FIG. 1, a circuit including a boost circuit shown in FIG. 10B is used for the Pierce circuit, and a source follower in which a NMOS transistor and a PMOS transistor shown in FIG. 11B are cascaded is used for the source-follower-type Colpitts circuit, and a Langasite type oscillator CTGS is used for the oscillator X1.

In order to show the characteristics of each circuit, the graphs in FIGS. 5 and 6 show the characteristics of only the Pierce circuit with fast oscillation start-up and the characteristics of only the source-follower-type Colpitts circuit with small steady-state current during oscillation, respectively. The numerical values in FIG. 5 show the time until the oscillation amplitude in the Pierce circuit reaches a predetermined steady-state value, and the numerical values in FIG. 6 show the time until the oscillation frequency in the respective circuits stabilizes at predetermined values and values of oscillation frequency in a stable state.

As shown in FIGS. 5 and 6, the oscillation start-up time is about 10 μs for both the amplitude and the frequency. This value is about ⅕₀ of typical start-up time using a quartz oscillator. In addition, by using the source-follower type Colpitts circuit shown in FIG. 11B, it is possible to reduce the steady-state current during oscillation as compared to a conventional Colpitts circuit. For example, in Document 2, it is possible to reduce the steady-state current during oscillation to about ⅕ of that of a conventional Colpitts circuit.

Figure 7:
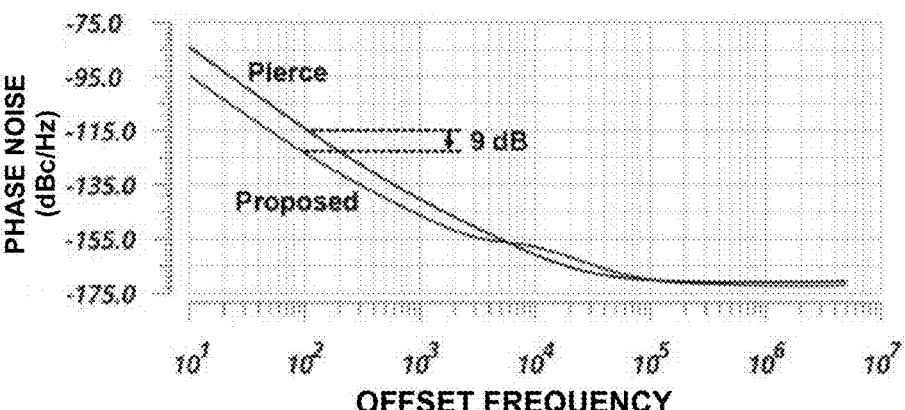
FIG. 7 shows phase noise characteristics of an oscillation circuit according to the embodiment of the present invention.

In addition, by using the source-follower type Colpitts circuit shown in FIG. 11B at the time of steady-state oscillation instead of a Pierce circuit, it is possible to improve phase noise characteristics of oscillation circuits related to code error rates of communication devices. FIG. 7 shows phase noise characteristics of an oscillation circuit according to the embodiment of the present invention. As shown in FIG. 7, the phase noise, which is an important oscillator circuit characteristic for communication devices, is improved by about 9 dB as compared to that of a conventional Pierce oscillator circuit in a range where the offset frequency from the fundamental frequency of the oscillator circuit is 100 Hz or less. In this way, by using the oscillation circuit according to this embodiment, it is possible to improve the phase noise characteristics at the time of steady-state oscillation as compared to that of a conventional Pierce oscillation circuit.

Regarding the timing of transitioning from the Pierce circuit for oscillation start-up to the Colpitts circuit for steady-state oscillation, that is, the switching timing of the switches (SW1 and SW2), it is necessary to stabilize the amplitude at the time of oscillation start-up of the Pierce circuit to some extent, and make use of the rapidity of oscillation start-up, which is a feature of the Pierce circuit, in order to smooth the transition of the oscillation frequency. For example, the point when the final convergence amplitude reaches 70-95% is the best timing for switching the switch.

Figure 8A:
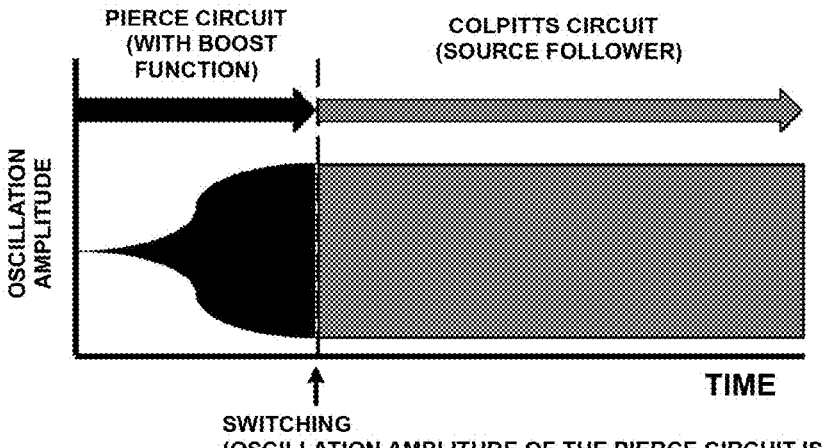
FIG. 8A shows oscillation amplitude characteristics when the Pierce circuit and the Colpitts circuit according to the embodiment of the present invention are switched by switches.
Figure 8B:
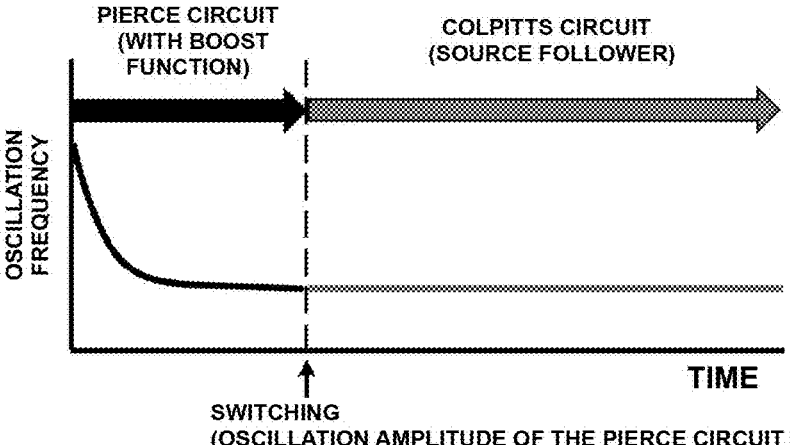
FIG. 8B shows oscillation frequency characteristics when the Pierce circuit and the Colpitts circuit according to the embodiment of the present invention are switched by switches.

FIGS. 8A and 8B show the characteristics of the oscillation amplitude and the oscillation frequency when the Pearce circuit and the Colpitts circuit are switched with a switch in the oscillation circuit 1. Stable natural frequency oscillations are produced on the oscillator X1 in the Pierce circuit at the time when the amplitude at the time of oscillation start-up of the Pierce circuit reaches 70-95% of the final convergence amplitude. Therefore, the oscillator X1 is shared by the Pierce circuit, which carries out stable natural frequency oscillations, and the Colpitts circuit where the start-up is slow alone as well. Thereby, the oscillation is maintained and the oscillation frequency is smoothly transitioned.

One of the switching conditions for smoother transition of the oscillation frequency is that the equivalent capacitance viewed from the oscillator X1 side is at the same level between before and after the switching. In practice, in the oscillation amplitude at the time of switching, there is a step in amplitude because the form of the oscillation circuit 1 changes. However, if the amplitude on the load side to which the oscillation circuit 1 of the present invention is connected is at a certain level or more, this issue would not be a problem in actual use. Meanwhile, there is a problem that the frequency change at the time of the switching is output to the load side directly. Therefore, in order to reduce the frequency change at the time of the switching, it is important that the equivalent capacitance viewed from the oscillator X1 is at the same level between before and after the switching.

Figure 9:
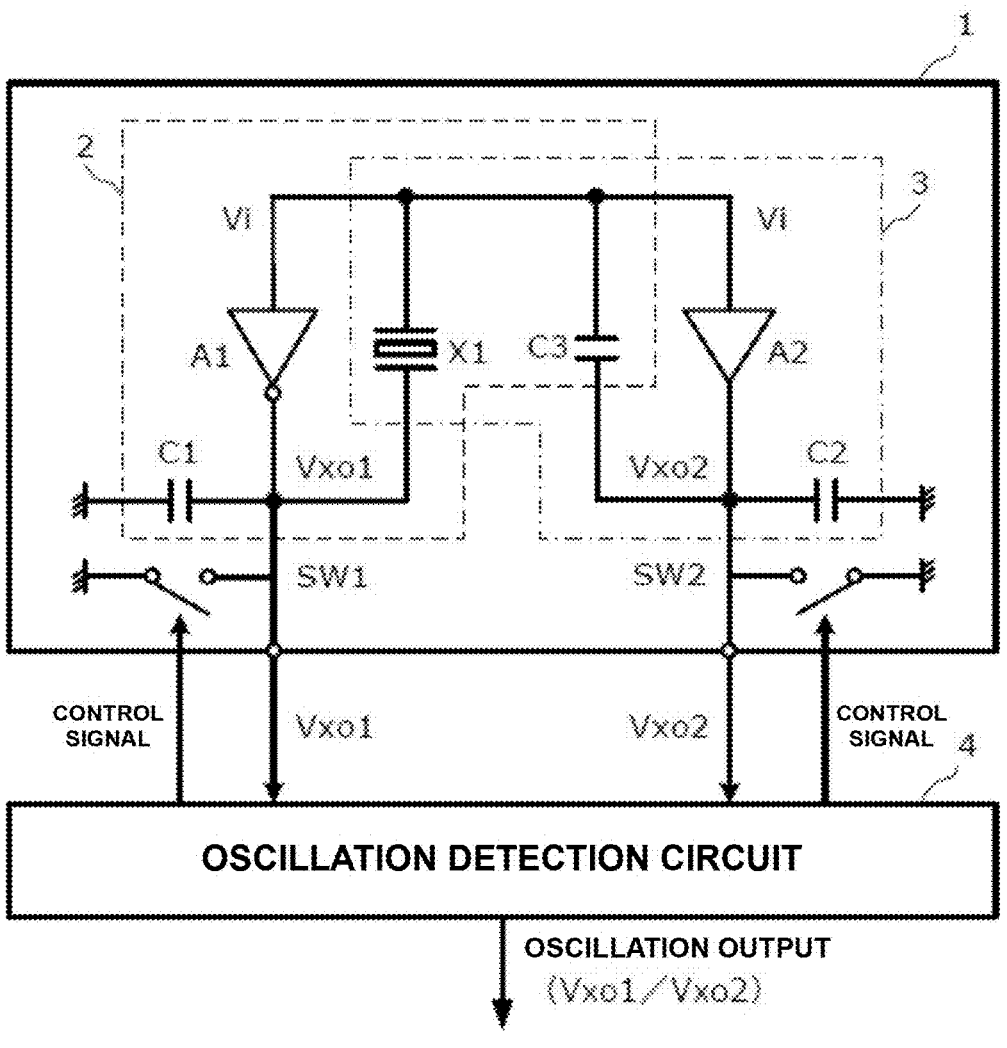
FIG. 9 schematically shows an oscillation detection circuit connected to an oscillation circuit according to an embodiment of the present invention.

Trigger signals for switching the switches (SW1 and SW2) may be output from a circuit that monitors the oscillation amplitude of the Pierce circuit. For example, as shown in FIG. 9, there may be an oscillation detection circuit 4 in the later stage of the oscillation circuit 1. This oscillation detection circuit 4 is configured to output a control signal when the oscillation amplitude of the oscillation signal Vxo1 of the Pierce circuit has a predetermined reference value or more. The control signal output from the oscillation detection circuit 4 can be used as a trigger signal for switching the switches (SW1, SW2).

The oscillation detection circuit 4 is configured to cause the switching from a first mode in which the oscillation signal Vxo1 of the Pierce circuit is output, to a second mode in which the oscillation signal Vxo2 of the Colpitts circuit is output, by switching the switches (SW1 and SW2) according to the oscillation amplitude of the oscillation signal Vxo1 of the Pierce circuit. The switching condition that the oscillation amplitude of the Pierce circuit is 70-95% of the final convergence amplitude is merely an example. In the oscillation detection circuit 4, the switching condition can be appropriately determined according to various conditions in implemented electronic devices or the like. For example, the switching conditions may be determined by taking into account the above-described equivalent capacity as viewed from the oscillator before and after the switching.

As described above, it is possible to achieve an oscillation circuit that achieves both high-speed start-up and low current consumption in accordance with this embodiment. It is possible to reduce the power consumption of the electronic device by implementing the oscillation circuit according to this embodiment in, for example, electronic devices such as mobile phones or IoT devices.

Scope of the Present Invention

The present invention is not limited to the embodiments described above. The present invention includes various modifications to the above-described embodiments that can be understood by a person skilled in the art within the scope of the technical idea of the present invention. The configurations described in the embodiments described above can be appropriately combined as long as they are consistent.

APPENDIX

Configurations disclosed herein, taking the above-described embodiments as examples, will be described below.

Appendix 1

An oscillation circuit comprising:
a Pierce circuit and a Colpitts circuit that share an oscillator and an input node to respective amplifiers; and
switches connected to output nodes of the respective amplifiers of the Pierce circuit and the Colpitts circuit, wherein
the switches are controlled to cause the oscillation circuit output oscillation signals of the Pierce circuit at the time of oscillation start-up and output oscillation signals of the Colpitts circuit at the time of steady-state oscillation.

US 12,627,260 B2

7

Appendix 2

An oscillation circuit including a Pierce circuit and a Colpitts circuit, wherein a first amplifier (A1) in the Pierce circuit and a second amplifier (A2) in the Colpitts circuit share an input node to the respective amplifiers, the oscillation circuit includes a first oscillation capacitance (C1) and a first switch (SW1) connected in parallel to the first oscillation capacitance (C1) between an output of the first amplifier (A1) and the ground, the oscillation circuit includes a second oscillation capacitance (C2) and a second switch (SW2) connected in parallel to the second oscillation capacitance (C2) between an output of the second amplifier (A2) and the ground, the oscillation circuit includes an oscillator (X1) between said input and said output of the first amplifier (A1), the oscillation circuit includes a third oscillation capacitance (C3) between said input and said output of the second amplifier (A2), and the oscillation circuit is configured to oscillate in a first mode at the time of oscillation start-up in which the first switch (SW1) and the second switch (SW2) are open and closed, respectively, and in a second mode at the time of steady-state oscillation in which the first switch (SW1) and the second switch (SW2) are closed and open, respectively.

Appendix 3

The oscillation circuit according to Appendix 2, wherein the oscillator is an oscillator using a Langasite type piezoelectric single crystal.

Appendix 4

The oscillation circuit according to Appendix 2, wherein switching from the first mode to the second mode is carried out when the oscillation amplitude of the Pierce circuit at oscillation start-up reaches 70-95% of the final convergence amplitude.

Appendix 5

The oscillation circuit according to Appendix 4, wherein the switching from the first mode to the second mode is carried out on the basis of a control signal from an oscillation detection circuit which compares the oscillation amplitude of the Pierce circuit with a predetermined reference value.

Appendix 6

The oscillation circuit according to any one of Appendices 2-5, wherein the first amplifier includes a configuration in which a plurality of amplifier circuits are connected in series, a first stage amplifier circuit of the plurality of amplifier circuits includes a capacitive feedforward path, and the second amplifier is a source follower in which an NMOS transistor and a PMOS transistor are cascaded.

Appendix 7

An electronic device including the oscillation circuit according to any one of Appendices 1-6.

8

INDUSTRIAL AVAILABILITY

The present invention can be applied to oscillation circuits used in small electronic devices.

REFERENCE SIGNS LIST

1: oscillation circuit
2: Pierce circuit
3: Colpitts circuit
4: oscillation detection circuit
A1, A2: amplifier
C1, C2, C3: oscillation capacity
SW1, SW2: switch
X1: oscillator

The invention claimed is:

1. An oscillation circuit including an oscillator, the oscillation circuit comprising:

a Pierce circuit and a Colpitts circuit that include a first amplifier and a second amplifier, respectively, and share the oscillator and an input node the first amplifier and the second amplifier;

a first switch connected to an output node of the first amplifier, and a second switch connected to an output node of the second amplifier, wherein the first switch and the second switch are controlled to cause the oscillation circuit output oscillation signals of the Pierce circuit at the time of oscillation start-up and output oscillation signals of the Colpitts circuit at the time of steady-state oscillation.

2. An oscillation circuit comprising a Pierce circuit including include a first amplifier (A1) and a first oscillation capacitance (C1), a Colpitts circuit including a second amplifier (A2) and a second oscillation capacitance (C2), a first switch (SW1) connected in parallel to the first oscillation capacitance (C1) between an output of the first amplifier (A1) and the ground, a second switch (SW2) connected in parallel to the second oscillation capacitance (C2) between an output of the second amplifier (A2) and the ground, an oscillator (X1) between an input and an output of the first amplifier (A1), and a third oscillation capacitance (C3) between an input and an output of the second amplifier (A2), wherein he Pierce circuit and the Colpitts circuit share an input node to the first amplifier and the second amplifier, the first switch (SW1) is open and the second switch (SW2) is closed in a first mode at the time of oscillation start-up, and the first switch (SW1) is closed and the second switch (SW2) is open in a second mode at the time of steady-state oscillation.

3. The oscillation circuit according to claim 2, wherein the oscillator is an oscillator using a Langasite type piezoelectric single crystal.

4. The oscillation circuit according to claim 2, wherein switching from the first mode to the second mode is carried out when the oscillation amplitude of the Pierce circuit at oscillation start-up reaches 70-95% of the final convergence amplitude.

5. The oscillation circuit according to claim 4, wherein the switching from the first mode to the second mode is carried out on the basis of a control signal from an oscillation detection circuit which compares the oscillation amplitude of the Pierce circuit with a predetermined reference value.

6. The oscillation circuit according to claim 2, wherein the first amplifier includes a configuration in which a plurality of amplifier circuits are connected in series, a first stage amplifier circuit of the plurality of amplifier circuits includes a capacitive feedforward path, and the second amplifier is a source follower in which an NMOS transistor and a PMOS transistor are cascaded.

7. An electronic device including the oscillation circuit according to claim 1.

8. The oscillation circuit according to claim 2, further comprising an oscillation detection circuit configured to output a control signal according to the oscillation amplitude of the Pierce circuit to control the first switch (SW1) and the second switch (SW2).

9. The oscillation circuit according to claim 3, wherein the first amplifier includes a configuration in which a plurality of amplifier circuits are connected in series, a first stage amplifier circuit of the plurality of amplifier circuits includes a capacitive feedforward path, and the second amplifier is a source follower in which an NMOS transistor and a PMOS transistor are cascaded.

10. The oscillation circuit according to claim 4, wherein the first amplifier includes a configuration in which a plurality of amplifier circuits are connected in series, a first stage amplifier circuit of the plurality of amplifier circuits includes a capacitive feedforward path, and the second amplifier is a source follower in which an NMOS transistor and a PMOS transistor are cascaded.

11. The oscillation circuit according to claim 5, wherein the first amplifier includes a configuration in which a plurality of amplifier circuits are connected in series, a first stage amplifier circuit of the plurality of amplifier circuits includes a capacitive feedforward path, and the second amplifier is a source follower in which an NMOS transistor and a PMOS transistor are cascaded.

\* \* \* \* \*